United States Patent
Smith

(10) Patent No.: US 8,691,614 B2
(45) Date of Patent: Apr. 8, 2014

(54) DIRECT READOUT FOCAL PLANE ARRAY

(71) Applicant: Raytheon Company, Waltham, MA (US)

(72) Inventor: Edward Peter Gordon Smith, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/868,510

(22) Filed: Apr. 23, 2013

(65) Prior Publication Data

US 2013/0237003 A1    Sep. 12, 2013

Related U.S. Application Data

(62) Division of application No. 13/189,109, filed on Jul. 22, 2011, now Pat. No. 8,441,087.

(51) Int. Cl.
*H01L 31/0248* (2006.01)
*H01L 31/0232* (2006.01)

(52) U.S. Cl.
USPC ............................................. 438/69; 257/432

(58) Field of Classification Search
USPC .............................................. 257/432; 438/69
See application file for complete search history.

(56) References Cited

U.S. PATENT DOCUMENTS

| | | |
|---|---|---|
| 4,686,761 A | 8/1987 | Hacskaylo |
| 4,791,467 A | 12/1988 | Amingual et al. |
| 4,970,566 A | 11/1990 | Mendelhall |
| 5,113,076 A | 5/1992 | Schulte |
| 5,114,866 A | 5/1992 | Ito et al. |
| 5,149,956 A | 9/1992 | Norton |
| 5,279,974 A | 1/1994 | Walsh |
| 5,300,777 A | 4/1994 | Goodwin |
| 5,380,669 A | 1/1995 | Norton |
| 5,389,575 A | 2/1995 | Chin et al. |
| 5,479,047 A | 12/1995 | Liao et al. |
| 5,581,084 A | 12/1996 | Chapman et al. |
| 5,621,238 A | 4/1997 | Dodd et al. |
| 5,731,621 A | 3/1998 | Kosai |
| 5,751,005 A | 5/1998 | Wyles et al. |
| 5,936,268 A | 8/1999 | Cockrum et al. |

(Continued)

FOREIGN PATENT DOCUMENTS

WO    2007135850 A1    11/2007

OTHER PUBLICATIONS

Hamamatsu Photonics, Solid State Division, PSD (Position Sensative Detector), Jul. 2003, pp. 1-16.

*Primary Examiner* — Zandra Smith
*Assistant Examiner* — Lawrence Tynes, Jr.
(74) *Attorney, Agent, or Firm* — Lando & Anastasi, LLP

(57) ABSTRACT

An image detector comprises a plurality of photosensitive detector unit cells interconnected to a plurality of integrated circuits by a plurality of direct bond interconnects. Each unit cell includes an absorber layer and a separation layer. The absorber layer absorbs incident photons such that the absorbed photons excite photocurrent comprising first charged carriers and second charged carriers having opposite polarities. The separation layer separates the first charged carriers for collection at one or more first contacts and the second charged carriers for collection at one or more second contacts. The first and second contacts include the direct bond interconnects to conduct the first charged carriers and the second charged carriers from the unit cells in order to facilitate image processing.

18 Claims, 2 Drawing Sheets

(56) References Cited

U.S. PATENT DOCUMENTS

| | | | |
|---|---|---|---|
| 5,959,339 A | 9/1999 | Chapman et al. | |
| 6,359,290 B1 | 3/2002 | Ehmke | |
| 6,573,488 B1 | 6/2003 | Takeshita et al. | |
| 6,657,194 B2 | 12/2003 | Ashokan et al. | |
| 6,815,790 B2 | 11/2004 | Bui et al. | |
| 6,956,214 B2 | 10/2005 | Wong et al. | |
| 6,962,835 B2 | 11/2005 | Tong et al. | |
| 7,217,982 B2 | 5/2007 | Taylor et al. | |
| 7,333,181 B1 | 2/2008 | Scott et al. | |
| 7,387,944 B2 | 6/2008 | Tong et al. | |
| 7,728,297 B2 | 6/2010 | Masafumi | |
| 2002/0109147 A1 | 8/2002 | Shirai et al. | |
| 2003/0160172 A1* | 8/2003 | Ashokan et al. | 250/338.4 |
| 2004/0135224 A1 | 7/2004 | Bui et al. | |
| 2004/0195509 A1* | 10/2004 | Sundaram et al. | 250/338.1 |
| 2005/0012030 A1 | 1/2005 | Mahajan et al. | |
| 2005/0083567 A1* | 4/2005 | Chun Liu et al. | 359/326 |
| 2007/0215900 A1 | 9/2007 | Maimon | |
| 2007/0235758 A1 | 10/2007 | Klipstein | |
| 2009/0242934 A1 | 10/2009 | Hu | |
| 2010/0308371 A1 | 12/2010 | Bui et al. | |
| 2011/0001165 A1 | 1/2011 | Smith et al. | |

* cited by examiner

DIRECT READOUT FOCAL PLANE ARRAY

CROSS-REFERENCE TO RELATED APPLICATIONS

The present application is a division of and claims the benefit under 35 U.S.C. §§120 and 121 of U.S. patent application Ser. No. 13/189,109 filed Jul. 22, 2011 entitled "DIRECT READOUT FOCAL PLANE ARRAY," which is herein incorporated by reference in its entirety.

BACKGROUND

Digital cameras, video cameras, and other image capturing devices may include focal plane arrays and processing circuitry to facilitate capturing an image. A focal plane array comprises a plurality of pixels utilized to sense incident light in the visible and non-visible spectra. The processing circuitry receives signals describing the incident light sensed by the pixels and generates the image according to the signals. In general, decreasing the pixel size facilitates using a higher density of pixels to yield a higher resolution image. If the pixel size becomes too small, however, the signal may propagate from one pixel to another and the resulting image may blur.

SUMMARY OF THE DISCLOSURE

According to one embodiment, an image detector comprises a plurality of photosensitive detector unit cells interconnected to a plurality of integrated circuits by a plurality of direct bond interconnects. Each unit cell includes an absorber layer and a separation layer. The absorber layer absorbs incident photons such that the absorbed photons excite photocurrent comprising first charged carriers and second charged carriers having opposite polarities. The separation layer separates the first charged carriers for collection at one or more first contacts and the second charged carriers for collection at one or more second contacts. The first and second contacts include the direct bond interconnects to conduct the first charged carriers and the second charged carriers from the unit cells in order to facilitate image processing.

Some embodiments of the disclosure may provide one or more technical advantages. A technical advantage of certain embodiments may be that direct bond interconnects may interconnect a photosensitive detector unit cell and an integrated circuit of a focal plane array. A technical advantage of certain embodiments may be that a focal plane array may be optimized for particular applications and uses. For example, the focal plane array may be optimized for use with particular desired wavelengths, including infrared wavelengths. Certain embodiments may comprise III-V infrared materials selected to withstand high process temperatures used to form direct bond interconnects. As another example, the focal plane array may be optimized to provide a small pixel size in order to yield high-resolution images.

Some embodiments may benefit from some, none, or all of these advantages. Other technical advantages may be readily ascertained by one of ordinary skill in the art.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1-4 of the drawings, like numerals being used for like and corresponding parts of the various drawings.

Figure 1:
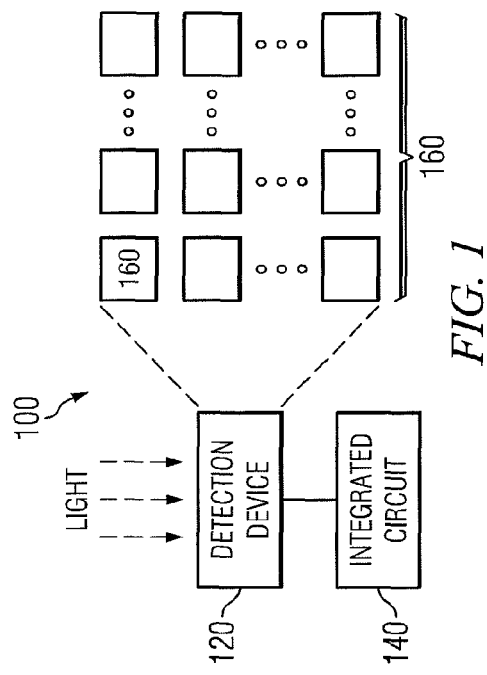
FIG. 1 depicts a simplified schematic diagram illustrating an image detector, in accordance with embodiments of the present disclosure.

FIG. 1 is a block diagram illustrating image detector 100, in accordance with embodiments of the present disclosure. Image detector 100 may be a focal plane array (FPA), active pixel sensor (APS), or any other suitable light sensing device used as a component of a photographic and/or image capturing device, such as a digital camera, video camera, or other device. Image detector 100 may include detection device 120 and integrated circuit 140.

In certain embodiments, detection device 120 includes an X×Y array of photosensitive detector unit cells 160. Detector unit cells 160 may accumulate charge or produce a current and/or voltage in response to light incident upon the detector unit cell 160 and may correspond to a pixel in a captured electronic image. In certain embodiments, one or more of detector unit cells 160 may include a photovoltaic detector (e.g., a photovoltaic single absorber detector or a photovoltaic multi-absorber (multi-junction) detector), a barrier device detector, a position sensitive detector (PSD), or other suitable detector. Detector unit cells 160 may comprise any suitable materials, dopant concentrations, number of layers, layer thicknesses, and/or other characteristics selected based on the type of photodetector.

Integrated circuit 140, such as a read out integrated circuit (ROIC), may be used for processing of the incident light (e.g., to create an image representative of the incident light). For example, integrated circuit 140 interfaces with detection device 120 to receive a signal, such as the accumulated charge or the current and/or voltage produced in response to light incident upon the detector unit cell 160. In certain embodiments, integrated circuit 140 may comprise an image processing unit and may include a combination of hardware, software, or firmware that is operable to convert the received signal into an electronic image.

In certain embodiments, integrated circuit 140 comprises an X×Y array of ROIC unit-cells. Each ROIC unit-cell may be interconnected with a corresponding detector unit cell 160 of the X×Y array of detector unit cells 160. The ROIC unit-cells and the detection device unit cells may be interconnected with one or more direct bond interconnects, such as direct metal-to-metal interconnects (e.g., independently of an indium interconnect). In certain embodiments, the interconnection may be made at the wafer level (rather than the die level) by providing the array of ROIC unit-cells as a ROIC wafer and the array of detector unit cells 160 as a detector wafer. Use of wafers may allow for efficient manufacture of image detector 100.

Figure 2:
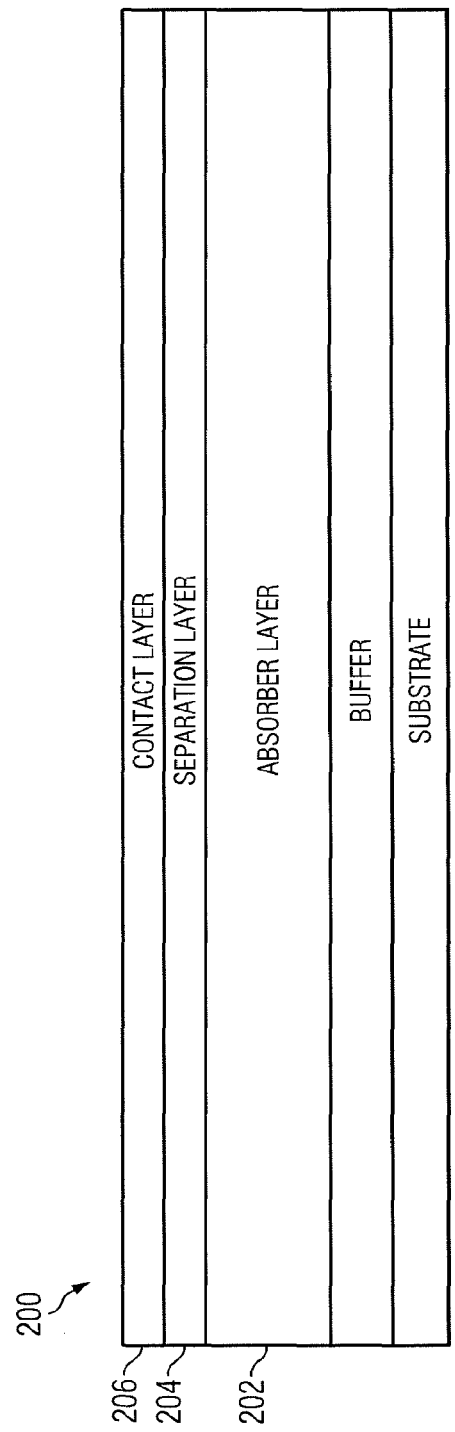
FIG. 2 depicts a cross-sectional view of a semiconductor substrate prior to post-processing to form a unit cell, in accordance with certain embodiments of the present disclosure.

FIG. 2 depicts a cross-sectional view of a semiconductor substrate 200 prior to post-processing to form detector unit cell 160, in accordance with certain embodiments of the present disclosure. In certain embodiments, semiconductor substrate 200 may provide a barrier device, such as a minority carrier isotype device, or a heterojunction device. As shown in FIG. 2, substrate 200 may include absorber layer 202, separation layer 204, and contact layer 206.

Substrate 200 may optionally include a base substrate, a buffer layer, a sheet layer (not shown), or other suitable layers.

In certain embodiments, the layers of semiconductor substrate 200 may be grown on the base substrate. The base substrate may comprise any substantially intrinsic semiconductor substrate (e.g., purely intrinsic or very lightly-doped), including without limitation silicon, cadmium zinc tellurium, germanium, silicon carbide, aluminum arsenide antimonide, gallium antimonide, gallium arsenide, gallium nitride (GaN), gallium phosphide, indium antimonide, indium arsenide, indium arsenide antimonide, indium gallium arsenide, indium nitride, indium phosphide, mercury cadmium tellurium, silicon germanium, or other suitable semiconductor material. The material or materials used for the base substrate may be selected based on desired characteristics for a unit cell to be fabricated from substrate 200.

Absorber layer 202 may be operable to absorb incident photons such that the absorbed photons excite positive charges and negative charges in absorber layer 202. Absorber layer 202 may comprise any substantially doped semiconductor substrate (e.g., dopant concentration between approximately $2 \times 10^{14}$ cm-3 and approximately $5 \times 10^{17}$ cm-3), including without limitation the semiconductors set forth above with respect to the base substrate. In certain embodiments, absorber layer 202 may be either an n-type semiconductor, a p-type semiconductor, or an intrinsic semiconductor. The material or materials used for absorber layer 202 may be selected based on desired characteristics for the unit cell (e.g., a material may be selected with a bandgap suitable for photon absorption, and thus light detection, of a particular wavelength or range of wavelengths). In certain embodiments, absorber layer 202 may be grown to a thickness of between approximately 1.0 µm and approximately 15.0 µm (e.g., to ensure absorber layer 202 is sufficiently thick to capture light of a particular intensity).

Separation layer 204 may comprise a barrier layer, a junction layer, or other suitable layer operable to receive charged carriers from absorber layer 202 and separate the first charged carriers for collection at a first contact and the second charged carriers for collection at a second contact. The first charged carriers may comprise charges having a first polarity and the second charged carriers may comprise charges having a second polarity (e.g., a polarity opposite that of the first charged carriers). As an example, the first charged carriers may comprise positive charges and the second charged carriers may comprise negative charges, or vice versa. Separation layer 204 may comprise any doped or undoped semiconductor, including without limitation the semiconductors set forth above with respect to the base substrate. In certain embodiments, the dopant concentration may be between approximately $2 \times 10^{14}$ cm-3 and approximately $5 \times 10^{17}$ cm-3. In certain embodiments, separation layer 204 may comprise the same type of doping as absorber layer 202 (e.g., both n-type or both p-type). For example, certain barrier devices may use the same type of doping in absorber layer 202 and separation layer 204. Alternatively, separation layer 204 may comprise a different type of doping than absorber layer 202 (e.g., absorber layer 202 may comprise n-type doping and separation layer 204 may comprise p-type doping, or vice versa). For example, junction devices and certain barrier devices may use opposite doping in absorber layer 202 and separation layer 204. In certain embodiments, separation layer 204 may be grown to a thickness of between approximately 0.1 µm and approximately 2.0 µm. The material or materials used for separation layer 204, the dopant concentration of separation layer 204, the thickness of separation layer 204, and/or other physical characteristics of separation layer 204 may be selected based on desired characteristics for the unit cell.

Contact layer 206 may comprise one or more direct bond interconnects. Each direct bond interconnect may be operable to conduct charged carriers to integrated circuit 140 external to the unit cells. Contact layer 206 may comprise any highly-doped semiconductor substrate (e.g., dopant concentration between approximately $1 \times 10^{16}$ cm-3 and approximately $5 \times 10^{18}$ cm-3), including without limitation the semiconductors set forth above with respect to the base substrate. In certain embodiments, contact layer 206 may comprise the same type of doping as absorber layer 202 (e.g., both n-type or both p-type). Alternatively, contact layer 206 may comprise a different type of doping than absorber layer 202 (e.g., absorber layer 202 may comprise n-type doping and contact layer 206 may comprise p-type doping, or vice versa). In certain embodiments, contact layer 206 may be grown to a thickness of between approximately 0.1 µm and approximately 2.0 µm. The material or materials used for contact layer 206, the dopant concentration of contact layer 206, the thickness of contact layer 206, and/or other physical characteristics of contact layer 206 may be selected based on desired characteristics for the unit cell. For example, certain physical characteristics may be selected based on a desired resistivity for contact layer 206.

As described above, the materials for each layer may be selected based on desired characteristics of the unit cell. In certain embodiments, the layers may comprise III-V materials. The III-V materials may include at least a first element found in group III of the periodic table and a second element found in group V of the periodic table. Group III elements may have three electrons in their outer-most electronic shell; examples include boron, aluminum, gallium, indium, and thallium. Group V elements may have five electrons in their outer-most electronic shell; examples include nitrogen, phosphorus, arsenic, antimony, and bismuth. The III-V materials may be well-suited to withstanding the high temperatures associated with interconnecting the unit cell and integrated circuit 140 with a direct bond interconnect. In certain embodiments, the III-V materials may include gallium antimonide in the base substrate, indium arsenide antimonide in absorber layer 202 and contact layer 206, and aluminum arsenide antimonide in separation layer 204. In certain embodiments, materials comprising antimonide or mercury cadmium tellurium may be well-suited to a unit cell designed to detect infrared light. In certain embodiments, materials comprising indium gallium arsenide or silicon germanium may be well-suited to a unit cell designed to detect visible light.

After one or more of the various layers described above have been formed, substrate 200 may be used to fabricate one or more unit cells, as described in greater detail below.

Figure 3:
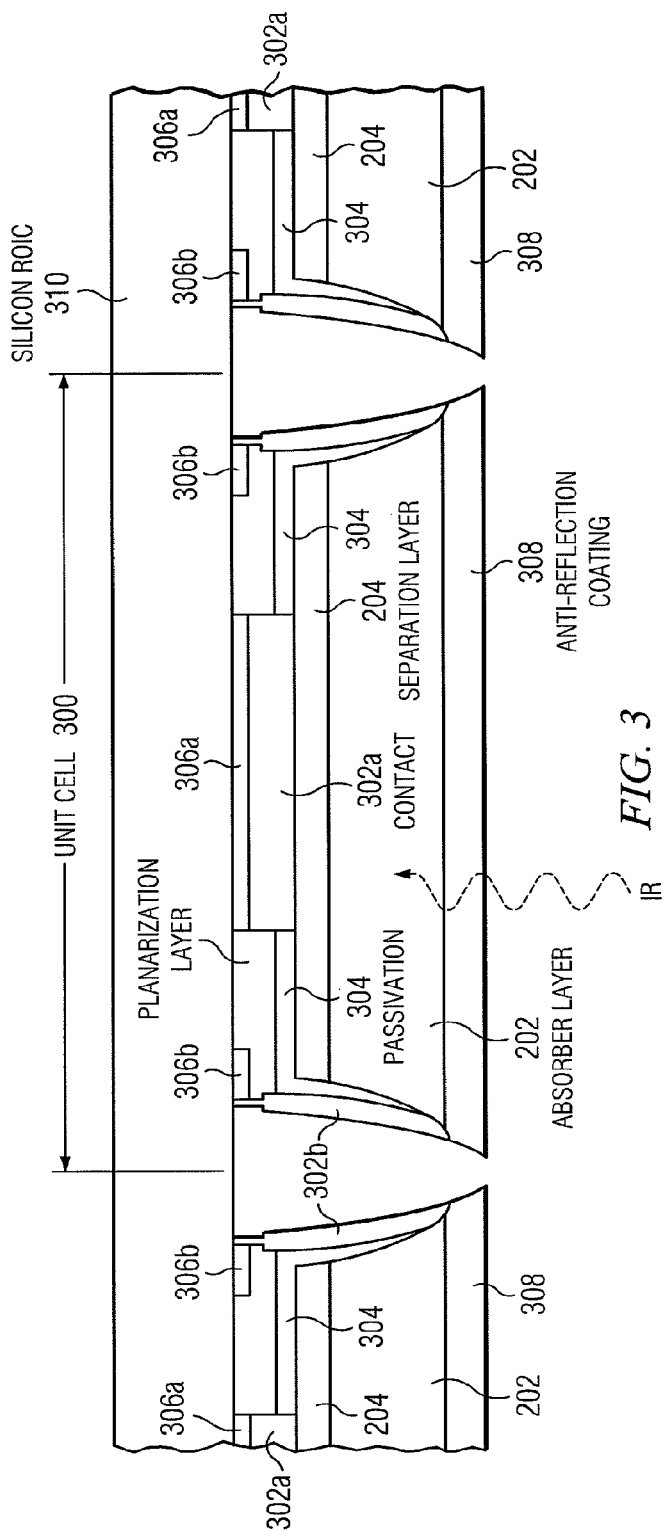
FIG. 3 depicts a cross-sectional view of a unit cell fabricated with the semiconductor substrate of FIG. 2, in accordance with certain embodiments of the present disclosure.

FIG. 3 depicts a cross-sectional view of unit cell 300. As shown in FIG. 3, unit cell 300 includes absorber layer 202, separation layer 204, and contact layer 206. Contact layer 206 comprises one or more of first contacts 302a and one or more second contacts 302b. First contacts 302a facilitate conducting first charged carriers (e.g., signal) from separation layer 204 to ROIC 310. Second contacts 302b facilitate conducting charged carriers (e.g., ground) from absorber layer 202 to ROIC 310. First contacts 302a may be electrically isolated from second contacts 302b by passivation 304. Direct bond interconnects 306a (e.g., signal interconnects) may interconnect first contacts 302a and ROIC 310, and direct bond interconnects 306b (e.g., ground interconnects) may interconnect second contacts 302b and ROIC 310. Unit cell 300 may optionally includes anti-reflection coating 308. For example, the base substrate and buffer layer illustrated in FIG. 2 may be removed, and anti-reflection coating 308 may be applied to a surface of absorber layer 202 adapted to receive light.

To fabricate unit cell 300 from semiconductor substrate 200, portions of absorber layer 202, separation layer 204, and contact layer 206 may be etched from substrate 200 using any suitable etching technique (e.g., wet chemical etching or dry plasma etching). The layers may be etched to define a pixel area for unit cell 300 (e.g., for when a unit cell 300 is used as a unit cell in an array of unit cells 300). Portions of contact layer 206 may be etched, for example, to define one or more areas of substrate 200 to be electrically coupled to other electrical and/or electronic circuitry external to unit cell 300, such as integrated circuit 140.

After portions of absorber layer 202, separation layer 204, and/or contact layer 206 have been etched, passivation 304 may be deposited on top of the exposed portions of unit cell 300. Passivation 304 may include silicon dioxide, silicon nitride, aluminum oxide, hafnium oxide, cadmium telluride, or any other suitable material. Passivation 304 may be deposited on substrate 200 via thermal evaporation, molecular beam epitaxy, plasma enhanced chemical vapor deposition, atomic layer deposition, or any other suitable technique. After depositing passivation 304, portions of passivation 304 may be removed (e.g., via wet chemical etching or dry plasma etching in order to expose the remaining portions of contact layer 206. Passivation 304 may serve to electrically isolate portions of substrate 200.

Contacts 302 may optionally include metal formed on portions of remaining contact layer 206 not covered by passivation 304 and may include a generally conductive material (e.g., aluminum, silver, copper, gold, or other suitable metal) to electrically couple contact layer 206 to electrical/electronic circuitry external to unit cell 300 through corresponding direct bond interconnects 306. The contact metal may be formed on substrate 200 via implantation, deposition, epitaxy, or any other suitable fabrication technique. For example, the contact metal may be formed by depositing aluminum upon substrate 200 and etching away those portions of the deposited aluminum which are not proximate to remaining portions of contact layer 206. Direct bond interconnects 306 may each couple corresponding portions of unit cell 300 and ROIC 310. Direct bond interconnects 306 may bond contact (s) 302 of unit cell 300 and integrated circuit 140 without any intermediate interconnects (e.g., without indium interconnects). The bonding process may be based on chemical bonds between two surfaces, such as a surface of a wafer comprising unit cells 300 and a surface of a wafer (e.g., a silicon wafer) comprising ROIC 310. Thus, direct bond interconnects 306 may be made at a wafer level (rather than at a die level). In certain embodiments, a planarization layer may provide flat, consistent contact between the wafers. Use of wafers may allow for efficient manufacture of the image detector by facilitating efficient removal of the base substrate and/or the buffer layer, and facilitating efficient application of anti-reflection coating 308 to the unit cells 300. In certain embodiments, the wafer materials may be selected to withstand high temperatures associated with direct bonding.

Direct bond interconnects 306a may conduct the first charged carriers to integrated circuit 140. In certain embodiments, each unit cell 300 of the focal plane array may comprise one or more direct bond interconnects 306a (e.g., signal interconnects) interconnecting with integrated circuit 140. Direct bond interconnects 306b may conduct the second charged carriers from second contacts 302b to ground. As an example, the first charged carriers may comprise positive charges and the second charged carriers may comprise negative charges. Alternatively, the first charged carriers may comprise the negative charges and the second charged carriers may comprise the positive charges. In certain embodiments, unit cells 300 of the focal plane array may be fully reticulated such that each unit cell 300 is electrically isolated from the other unit cells 300. Full reticulation may prevent or reduce signal propagation from one unit cell 300 to the next and may be particularly suitable to focal plane arrays comprising a small pixel size with a high pixel density. In a fully reticulated focal plane array, portions of absorber layer 202, separation layer 204, and contact layer 206 may be etched to define a gap between unit cell 300 and the adjacent unit cells, and unit cell 300 may optionally include the base substrate layer. If included, the base substrate layer may also be etched to delineate unit cell 300 from the adjacent unit cells. Each unit cell 300 of the fully reticulated focal plane array may comprise a direct bond interconnect 306b interconnecting unit cell 300 to ground.

In certain alternative embodiments, unit cells 300 of the focal plane array may be partially reticulated. For example, portions of contact layer 206 may be etched to define a gap between unit cell 300 and the adjacent unit cells. The other layers may each be continuous from one unit cell 300 to the next. The focal plane array may comprise a common direct bond interconnect 306b operable to conduct the second charged carriers from the plurality of unit cells 300 to ground. That is, the same direct bond interconnect 306b may be shared by the plurality of unit cells 300. In certain embodiments, one or more of the ground interconnects may be positioned at the periphery of the focal plane array to interconnect the continuous absorber layer 202 to ground.

In certain embodiments, focal plane array and/or integrated circuit 140 may comprise one or more additional structures for adjusting the performance of imaging system 100. As an example, one or more microlenses may be used to focus the photons onto photosensitive portions of the unit cells. In certain embodiments, each unit cell may correspond to a microlens. As another example, one or more filters may be used to filter the photons according to wavelength. In certain embodiments, each unit cell may correspond to a filter adapted to pass infrared wavelengths to the unit cell. As yet another example, a thermal mismatch compensation structure may be included to accommodate a thermal mismatch between detection device 120 and integrated circuit 140. In certain embodiments a wafer comprising integrated circuit 140 may include the thermal mismatch compensation structure. For example, the thermal mismatch compensation structure may be positioned proximate to a bottom surface of the integrated circuit wafer, and interconnections to detection device 120 may be positioned at a top surface of the integrated circuit wafer. The thermal mismatch compensation structure may address differences in the thermal expansion properties of detection device 120 and integrated circuit 140. For example, detection device 120 and integrated circuit 140 may comprise different materials having different thermal expansion coefficients.

Figure 4:
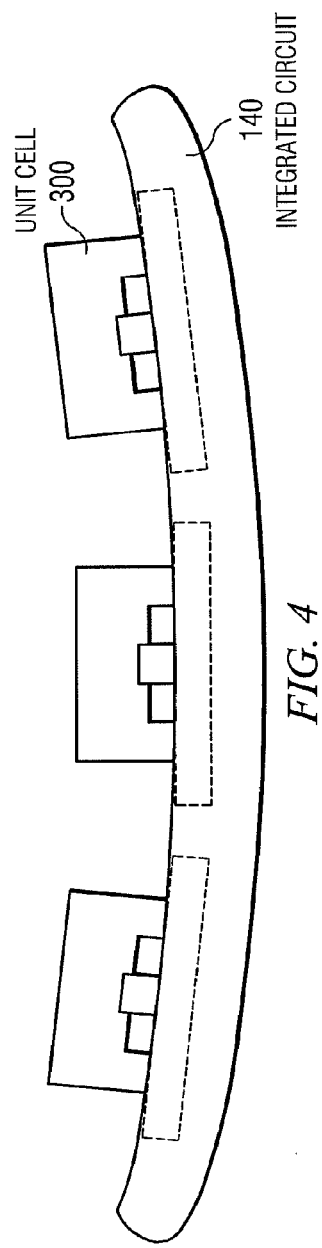
FIG. 4 depicts an example of a fully reticulated curved array of unit cells.

In certain embodiments, the focal plane array may comprise a curved focal plane array. FIG. 4 depicts an example of a fully reticulated curved focal plane array of detection devices where each detection device has direct bond interconnects for first and second charged carriers to integrated circuit.

Although the embodiments in the disclosure have been described in detail, numerous changes, substitutions, variations, alterations, and modifications may be ascertained by those skilled in the art. Additionally or alternatively, while certain embodiments of the disclosure have been described with reference to infrared detectors, the embodiments disclosed herein may be utilized with many types of detectors including, but not limited to, visible, infrared, ultraviolet, x-ray, or other radiation detectors. It is intended that the present disclosure encompass all such changes, substitutions, variations, alterations and modifications as falling within the spirit and scope of the appended claims.

Modifications, additions, or omissions may be made to the methods described without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A method of manufacturing a photosensitive detector unit cell of a detection device, comprising: depositing a separation layer outwardly from an absorber layer, the absorber layer operable to absorb incident photons such that the absorbed photons excite photocurrent comprising first charged carriers and second charged carriers, the second charged carriers having an opposite polarity of the first charged carriers, the separation layer operable to separate the first charged carriers and the second charged carriers; depositing a contact layer outwardly from the separation layer, the contact layer comprising a first contact operable to conduct the first charged carriers from the separation layer; and interconnecting the first contact to an integrated circuit with a direct bond interconnect operable to conduct the first charged carriers to the integrated circuit in order to facilitate image processing; and wherein the contact layer further comprises a second contact and wherein the method further comprises connecting the second contact to ground using a ground interconnect, the ground interconnect operable to conduct the second charged carriers from the unit cell and other unit cells of the detection device.

2. The method of claim 1, further comprising connecting the unit cell to ground using a ground interconnect operable to conduct the second charged carriers, the ground interconnect electrically isolated from other unit cells of the detection device.

3. The method of claim 1, further comprising selecting materials for the unit cell, the materials comprising III-V semiconductor materials.

4. The method of claim 1, further comprising selecting materials for the absorber layer, the materials selected to absorb photons of infrared wavelengths.

5. The method of claim 1, further comprising fully reticulating the unit cell from other unit cells of the detection device.

6. The method of claim 1, wherein the unit cell corresponds to a pixel of a curved focal plane array.

7. The method of claim 1, wherein a first wafer comprises the unit cell, a second wafer comprises the integrated circuit, and the direct bond interconnects interconnect the unit cell and the integrated circuit at a wafer level.

8. The method of claim 1, further comprising associating the unit cell with a microlens adapted to focus the photons onto photosensitive portions of the unit cell.

9. The method of claim 1, further comprising associating the unit cell with a filter adapted to filter the photons according to wavelength.

10. The method of claim 1, wherein the ground interconnect is a direct bond interconnect.

11. A method of manufacturing a detection device including a plurality of photosensitive detector unit cells arranged in an array, the method comprising:
depositing a separation layer outwardly from an absorber layer within each one of the plurality of photosensitive detector unit cells, each absorber layer operable to absorb incident photons such that the absorbed photons excite photocurrent comprising first charged carriers and second charged carriers, the second charged carriers having an opposite polarity of the first charged carriers, each separation layer operable to separate the first charged carriers and the second charged carriers;
depositing a contact layer outwardly from each separation layer within each one of the plurality of photosensitive detector unit cells, each contact layer comprising a first contact operable to conduct the first charged carriers from the separation layer; and
interconnecting the first contact of each one of the plurality of photosensitive detector unit cells to an integrated circuit with a direct bond interconnect operable to conduct the first charged carriers to the integrated circuit in order to facilitate image processing; and wherein each contact layer further comprises a second contact and wherein the method further comprises connecting each second contact to ground using a ground interconnect, the ground interconnect operable to conduct the second charged carriers from the plurality of photosensitive unit cells of the detection device.

12. The method of claim 11, further comprising connecting each one of the plurality of photosensitive unit cells to ground using a ground interconnect operable to conduct the second charged carriers, the ground interconnect of each one of the plurality of photosensitive unit cells being electrically isolated from each other unit cell of the detection device within the array.

13. The method of claim 11, further comprising selecting materials for the plurality of photosensitive unit cells, the materials comprising III-V semiconductor materials.

14. The method of claim 11, further comprising selecting materials for the absorber layer of each one of the plurality of photosensitive unit cells, the materials selected to absorb photons of infrared wavelengths.

15. The method of claim 11, further comprising fully reticulating one of the plurality of photosensitive unit cells from other unit cells of the detection device within the array.

16. The method of claim 11, wherein each one of the plurality of photosensitive unit cells corresponds to a pixel of a curved focal plane array.

17. The method of claim 11, further comprising associating at least one of the plurality of photosensitive unit cells with a microlens adapted to focus the photons onto photosensitive portions of the at least one of the plurality of photosensitive unit cells.

18. The method of claim 11, further comprising associating at least one of the plurality of unit cells with a filter adapted to filter the photons according to wavelength.

* * * * *